(12) United States Patent
Grill et al.

(10) Patent No.: US 6,479,110 B2
(45) Date of Patent: Nov. 12, 2002

(54) MULTIPHASE LOW DIELECTRIC CONSTANT MATERIAL AND METHOD OF DEPOSITION

(75) Inventors: Alfred Grill, White Plains, NY (US); Vishnubhai Vitthalbhai Patel, Yorktown, NY (US); Stephen McConnell Gates, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/966,836

(22) Filed: Sep. 27, 2001

(65) Prior Publication Data

US 2002/0037442 A1 Mar. 28, 2002

Related U.S. Application Data

(62) Division of application No. 09/320,495, filed on May 26, 1999, now Pat. No. 6,312,793.

(51) Int. Cl.[7] .................................................. H01L 21/31
(52) U.S. Cl. ...................... 427/577; 427/579; 427/489; 438/680; 438/681
(58) Field of Search ................................. 427/577, 579, 427/489; 428/312.6, 315.5, 305.5, 320.2, 314.4; 438/622, 513, 778, 680, 681

(56) References Cited

U.S. PATENT DOCUMENTS

| | | | | |
|---|---|---|---|---|
| 5,767,238 A | | 6/1998 | Caporale | 530/334 |
| 5,962,079 A | | 10/1999 | Koberstein et al. | 427/508 |
| 6,143,360 A | | 11/2000 | Zhong | 427/244 |
| 6,147,009 A | | 11/2000 | Grill et al. | 438/780 |
| 6,159,871 A | * | 12/2000 | Loboda et al. | 438/758 |
| 6,248,673 B1 | * | 6/2001 | Huang et al. | 438/778 |
| 6,376,391 B1 | * | 4/2002 | Olson et al. | 438/758 |
| 6,399,489 B1 | * | 6/2002 | M'Saad et al. | 438/479 |

OTHER PUBLICATIONS

Mikoshiba, et al; "Preparation of low density . . . by baking trifluoropropylsilyl copolymers"; J. Mater. Chem., Feb. 1999, 9; pp: 591–598.

* cited by examiner

Primary Examiner—Ngoc-Yen Nguyen
(74) Attorney, Agent, or Firm—Robert M. Trepp; Randy W. Tung

(57) ABSTRACT

A low dielectric constant, multiphase material which can be used as an interconnect dielectric in IC chips is disclosed. Also disclosed is a method for fabricating a multiphase low dielectric constant film utilizing a plasma enhanced chemical vapor deposition technique. Electronic devices containing insulating layers of the multiphase low dielectric constant materials that are prepared by the method are further disclosed.

27 Claims, 4 Drawing Sheets

MULTIPHASE LOW DIELECTRIC CONSTANT MATERIAL AND METHOD OF DEPOSITION

This is a divisional of copending application Ser. No. 09/320,495 filed on May 26, 1999 now U.S. Pat. No. 6,312,793.

FIELD OF THE INVENTION

The present invention generally relates to a multiphase material that has a low dielectric constant (or low k), a method for fabricating films of this material and electronic devices containing such films. More particularly, the present invention relates to a low dielectric constant, multiphase material for use as an intralevel or interlevel dielectric film, a cap material, or a hard mask/polish stop in a ULSI back-end-of-the-line (BEOL) wiring structure, electronic structures containing the films and a method for fabrication such films and structures.

BACKGROUND OF THE INVENTION

The continuous shrinking in dimensions of electronic devices utilized in ULSI circuits in recent years has resulted in increasing the resistance of the BEOL metallization as well as increasing the capacitance of the intralayer and interlayer. This combined effect increases signal delays in ULSI electronic devices. In order to improve the switching performance of future ULSI circuits, low dielectric constant (k) insulators and particularly those with k significantly lower than that of silicon oxide are needed to reduce the capacitances. Dielectric materials that have low k values have been commercially available, for instance, one of such materials is polytetrafluoroethylene (PTFE) with a k value of 2.0. However, these dielectric materials are not thermally stable when exposed to temperatures above 300~350° C. which renders them useless during integration of these dielectrics in ULSI chips which require a thermal stability of at least 400° C.

The low-k materials that have been considered for applications in ULSI devices include polymers containing Si, C, O, such as methylsiloxane, methylsesquioxanes, and other organic and inorganic polymers. For instance, materials described in a paper "Properties of new low dielectric constant spin-on silicon oxide based dielectrics" by N. Hacker et al., published in Mat. Res. Soc. Symp. Proc., vol. 476 (1997) p25 appear to satisfy the thermal stability requirement, even though some of these materials propagate cracks easily when reaching thicknesses needed for integration in the interconnect structure when films are prepared by a spin-on technique. Furthermore, the precursor materials are high cost and prohibitive for use in mass production. In contrast to this, most of the fabrication steps of VLSI and ULSI chips are carried out by plasma enhanced chemical or physical vapor deposition techniques. The ability to fabricate a low-k material by a PECVD technique using readily available processing equipment will thus simplify its integration in the manufacturing process, reduce manufacturing cost, and create less hazardous waste. A co-pending application (Ser. No. 09/107,567) assigned to the common assignee of the present invention, which is incorporated here by reference in its entirety, described a low dielectric constant material consisting of Si, C, O, and H atoms having a dielectric constant not more than 3.6 and which exhibits very low crack propagation velocities. Further reduction of the dielectric constant of such a material will further improve the performance of electronic devices incorporating such dielectric.

It is therefore an object of the present invention to provide a low dielectric constant material consisting of two or more phases and having a dielectric constant of not more than 3.2.

It is another object of the present invention to provide methods for fabricating the multiphase materials of this invention.

It is a further object of the present invention to provide a method for fabricating a multiphase material wherein the first phase is a hydrogenated oxidized silicon carbon film ( contains Si, C, O, and H and henceforth called SiCOH), and at least a second phase consisting essentially of C and H atoms.

It is a further object of the present invention to prepare a multiphase material that contains nanometer-sized voids.

It is another further object of the present invention to prepare a multiphase material that has a dielectric constant which is at least 10% lower than that of a single phase SiCOH dielectric material.

It is another further object of the present invention to provide a method for fabricating a low dielectric constant, thermally stable multiphase film from a precursor mixture which contains two or more different precursor molecules.

It is still another further object of the present invention to provide a method for fabricating a low dielectric constant material including two or more phases in a parallel plate plasma enhanced chemical vapor deposition chamber.

It is still another further object of the present invention to provide a method for fabricating a low dielectric constant material including two or more phases using a remote plasma chemical vapor deposition process.

It is yet another object of the present invention to provide a method for fabricating a multiphase material for use in electronic structures as an intralevel or interlevel dielectric in a BEOL interconnect structure.

It is yet another further object of the present invention to provide a multiphase material with a low internal stress and a dielectric constant of not higher than 3.2.

It is still another further object of the present invention to provide an electronic structure incorporating layers of insulating materials as intralevel or interlevel dielectrics in a BEOL wiring structure in which at least one of the layers of insulating materials is a multiphase material.

It is yet another further object of the present invention to provide an electronic structure which has layers of multiphase materials as intralevel or interlevel dielectrics in a BEOL wiring structure which contains at least one dielectric cap layer formed of different materials for use as a reactive ion etching mask, a polish stop or a diffusion barrier.

SUMMARY OF THE INVENTION

In accordance with the present invention, a novel dielectric material that has two or more phases wherein the first phase is formed of a SiCOH material is provided. The invention further provides a method for fabricating the multiphase material by reacting a first precursor gas containing atoms of Si, C, O, and H and at least a second precursor gas containing mainly atoms of C, H, and optionally F, N and O in a plasma enhanced chemical vapor deposition chamber. The present invention still further provides an electronic structure that has layers of insulating materials as intralevel or interlevel dielectrics used in a BEOL wiring structure wherein the insulating material may be a multiphase film.

In a preferred embodiment, a method for fabricating a dual phase film is described. In the dual phase film, the first phase is formed of hydrogenated oxidized silicon carbon and the second phase is formed of mainly C and H atoms. The method can be carried out by the operating steps of first providing a plasma enhanced chemical vapor deposition chamber, positioning an electronic structure in the chamber, flowing a first precursor gas containing atoms of Si, C, O, and H into the chamber, flowing a second precursor gas mixture containing atoms of C, H, and optionally F, N and O, into the chamber, and depositing a dual-phase film on the substrate. Optionally, the deposited film can be heat treated at a temperature of not less than 300° C. for a time period of at least 0.25 hour. The method may further include the step of providing a parallel plate reactor which has a conductive area of a substrate chuck between about 300 cm$^2$ and about 700 cm$^2$, and a gap between the substrate and a top electrode between about 1 cm and about 10 cm. A RF power is applied to at least one of the electrodes. The substrate may be positioned on the powered electrode or on the grounded electrode.

The first precursor utilized may be selected from molecules containing at least some of Si, C, O, and H atoms. Oxidizing molecules such as $O_2$ or $N_2O$ can be added to the first precursor. Preferably the first precursor is selected from molecules with ring structures such as 1,3,5,7-tetramethylcyclotetrasiloxane (TMCTS or $C_4H_{16}O_4Si_4$), tetraethylcyclotetrasiloxane ($C_8H_{24}O_4Si_4$), decamethylcyclopentasiloxane ($C_{10}H_{30}O_5Si_5$) molecules of methylsilanes mixed with an oxidizing agent such as $O_2$ or $N_2O$ or precursor mixtures including Si, O and C. The precursor can be delivered directly as a gas to the reactor, delivered as a liquid vaporized directly within the reactor, or transported by an inert carrier gas such as helium or argon. The precursor mixture may further contain elements such as nitrogen, fluorine or germanium.

The second precursor gas mixture utilized may be selected from molecules containing C and H atoms. Optionally, O, N or F atoms may be contained in the molecules, or molecules containing such atoms may be added to the precursor mixture. In one embodiment, the second precursor is selected from the group comprising molecules with ring structures containing C and H atoms, such as cyclic hydrocarbons, cyclic alcohols, cyclic ethers, cyclic aldehydes, cyclic ketones, cyclic esters, pheonols, cyclic amines, or other O, N or F containing cyclic hydrocarbons. More preferably, the second precursor molecule is a multicyclic (or polycyclic) hydrocarbon containing about 6 to 12 carbon atoms, with preferred examples being 2,5-norbornadiene ( also known as bicyclo[2.2.1]hepta-2,5-diene), norbornylene 2,5-norbornadiene (also known as bicyclo[2.2.1]hepta-2,5-diene ), norbornane (also known as bicyclo[2.2.1]heptane ). Other examples are tricyclo [3.2.1.0]octane, tricyclo[3.2.2.0]nonane, connected ring hydrocarbons such as spiro[3.4]octane, spiro[4.5]nonane, spiro[5.6]decane, and the like. Alternatively, cyclic hydrocarbons containing from 5 to 12 carbon atoms (cyclopentane, cyclohexane, and the like) and also cyclic aromatic hydrocarbons containing 6 to 12 C atoms (benzene, toluene, xylenes, and the like) may be used. Optionally, O or F atoms may be contained in the molecules, or molecules containing such atoms added to the precursor mixture.

In another embodiment, a method for fabricating a dual-phase film consisting of hydrogenated oxidized silicon carbon and a second phase consisting essentially of C and H atoms can be carried out by the operating steps of first providing a parallel plate deposition chamber, positioning an electronic structure in the chamber, providing a remote plasma source, flowing a first precursor gas containing atoms of Si, C, O, and H into the plasma source and from there into the deposition chamber, flowing a second gas mixture containing atoms of C, H, and optionally O, directly into the chamber, depositing a multiphase film on the substrate.

In yet another embodiment, a multiphase film is described. The multiphase film is prepared by the same procedures as described above for the dual-phase film, however, the second precursor gas mixture contains atoms of C, H and optionally, F, N, and O in at least two types of molecules. In one example, the mixture consists of at least one of cyclic molecules, as those described above, and at least one of noncyclic type molecules selected from the group of alkanes, alkenes, alkynes, ethers, alcohols, esters, ketones, aldehydes, amines, or other O, N or F containing noncyclic hydrocarbons.

The deposition of the multiphase material of this invention may further include the steps of setting the substrate temperature at between about 25° C. and about 400° C., setting the RF power density at between about 0.02 W/cm$^2$ and about 5.0 W/cm$^2$, setting the first precursor flow rate at between about 5 sccm and about 1000 sccm, setting the flow rate of the first gas of the second precursor between about 5 sccm and about 1000 sccm, setting the flow rate of the second gas of the second precursor between about 5 sccm and about 1000 sccm, setting the chamber pressure at between about 50 m Torr and about 10 Torr, and setting a substrate DC bias at between about 0 VDC and about −400 VDC.

The present invention is further directed to an electronic structure which has layers of insulating materials as intra-level or interlevel dielectrics in a BEOL interconnect structure which includes a pre-processed semiconducting substrate that has a first region of metal embedded in a first layer of insulating material, a first region of conductor embedded in a second layer of insulating material which includes a multiphase material, the second layer of insulating material being in intimate contact with the first layer of insulating material, the first region of conductor being in electrical communication with the first region of metal, and a second region of conductor being in electrical communication with the first region of conductor and being embedded in a third layer of insulating material including a multiphase material, the third layer of insulating material being in intimate contact with the second layer of insulating material.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

The dielectric cap material can be selected from silicon oxide, silicon nitride, silicon oxinitride, refractory metal silicon nitride with the refractory metal being Ta, Zr, Hf or W, silicon carbide, silicon carbo-oxide, and their hydrogenated compounds. The first and the second dielectric cap layer may be selected from the same group of dielectric materials. The first layer of insulating material may be silicon oxide or silicon nitride or doped varieties of these materials, such as PSG or BPSG. The electronic structure may further include a diffusion barrier layer of a dielectric material deposited on at least one of the second and third layer of insulating material. The electronic structure may further include a dielectric layer on top of the second layer of insulating material for use as a RIE hard mask/polish stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer, a second dielectric RIE hard mask/polish-stop layer on top of the third layer of insulating material, and a second dielectric diffusion barrier layer on top of the second dielectric polish-stop layer. The electronic structure may further include a dielectric cap layer of same materials as mentioned above between an interlevel dielectric of a multiphase material and an intralevel dielectric of a multiphase material.

BRIEF DESCRIPTION OF THE DRAWINGS

These and other objects, features and advantages of the present invention will become apparent from the following detailed description and the appended drawings in which.

DETAILED DESCRIPTION OF THE DRAWINGS

The present invention discloses a novel multiphase material that has a low dielectric constant, and a method for fabricating films of the material. The material disclosed in the preferred embodiment contains at least two phases, in which the first phase is a "host" matrix of a hydrogenated oxidized silicon carbon material (SiCOH) consisting of Si, C, O and H in a covalently bonded network and having a dielectric constant of not more than 3.6. The other phases of the material of the invention consist mainly of C and H atoms. The multiphase material may further contain molecular scale voids, i.e., approximately 0.5 to 20 nanometer in diameter. The present invention further discloses a method for fabricating a multiphase material in a parallel plate plasma enhanced chemical vapor deposition chamber. A first precursor gas containing Si, O, C and H and optionally molecules which have a ring structure, and a second precursor gas or gas mixture containing one or more types of molecules comprising carbon and hydrogen atoms, can be used for forming the multiphase film. The low dielectric constant multiphase film of the invention can further be heat treated at a temperature not less than 300° C. for at least 0.5 hour to reduce the dielectric constant.

During this heat treatment step, molecular fragments derived from the second precursor gas (or gas mixture) containing essentially carbon and hydrogen atoms may thermally decompose and may be converted into smaller molecules which are released from the film. Optionally, further development of voids may occur in the film by said process of conversion and release of the molecular fragments. The film density is thus decreased.

The present invention discloses a method for preparing a material having two or more phases that has a low dielectric constant, i.e., lower than 3.2, which is suitable for integration in a BEOL wiring structure. The films can be prepared by choosing at least two suitable precursors and a specific combination of processing parameters as described below.

Figure 1:
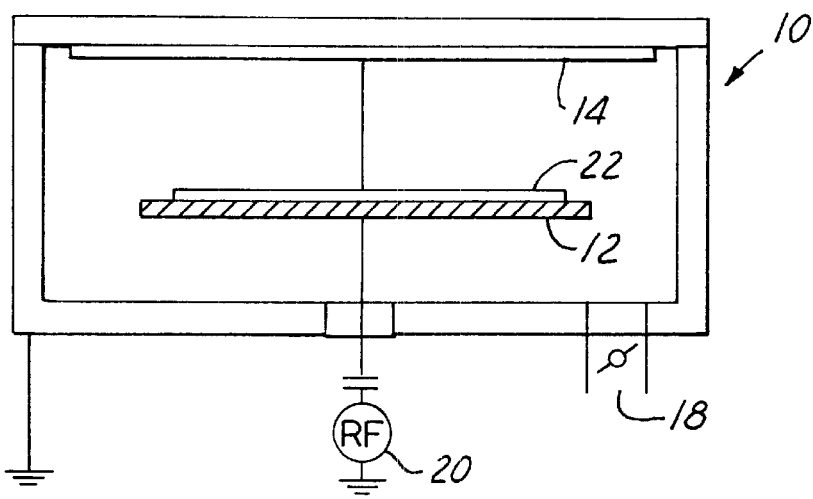
FIG. 1 is a cross-sectional view of the present invention parallel plate chemical vapor deposition chamber.

Referring initially to FIG. 1 wherein a simplified view of a PECVD reactor 10 for processing 200 mm wafers is shown. The gas precursors are introduced into reactor 10 through the gas distribution plate (GDP) 14, which is separated from the substrate chuck 12 by a gap and are pumped out through a pumping port 18. The RF power 20 is connected to the substrate chuck 12 and transmitted to the substrate 22. For practical purposes, all other parts of the reactor are grounded. The substrate 22 thus acquires a negative bias, whose value is dependent on the reactor geometry and plasma parameters. In a different embodiment, the RF power 20 can be connected to the GDP 14, which is electrically insulated from the chamber, and the substrate chuck 12 is grounded. In another embodiment, more than one electrical power supply can be used. For instance, two power supplies can operate at the same RF frequency, or one may operate at a low frequency and one at a high frequency. The two power supplies may be connected both to the same electrode or to separate electrodes. In another embodiment, the RF power supply can be pulsed on and off during deposition. Process variables controlled during deposition of the low-k films are RF power, precursor mixture and flow rate, pressure in reactor, and substrate temperature. Following is a first example of deposition of the present invention film from a first precursor ( TMCTS) and a second precursor 2,5-norbornadiene ( also known as bicyclo[2.2.1]hepta-2,5-diene, or BCHD ). In the example, the TMCTS precursor vapors were transported into the reactor by using He as a carrier gas. Optionally, the films were heat treated at 400° C. after deposition to reduce k.

Figure 2A:
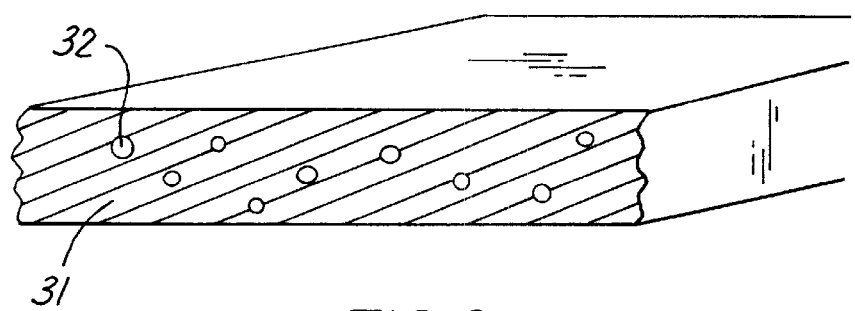
FIG. 2A is an enlarged, cross-sectional view of the present invention dual-phase material.

Referring now to FIG. 2A, the dual-phase material of the present invention is shown in an enlarged, cross-sectional view. The first phase 31 is a "host" matrix which is a hydrogenated oxidized silicon carbon material (SiCOH) including Si, C, O and H in a covalently bonded network and has a dielectric constant of not more than 3.6. The covalently bonded network structure of the first phase is shown in FIG. 2B.

Figure 2B:
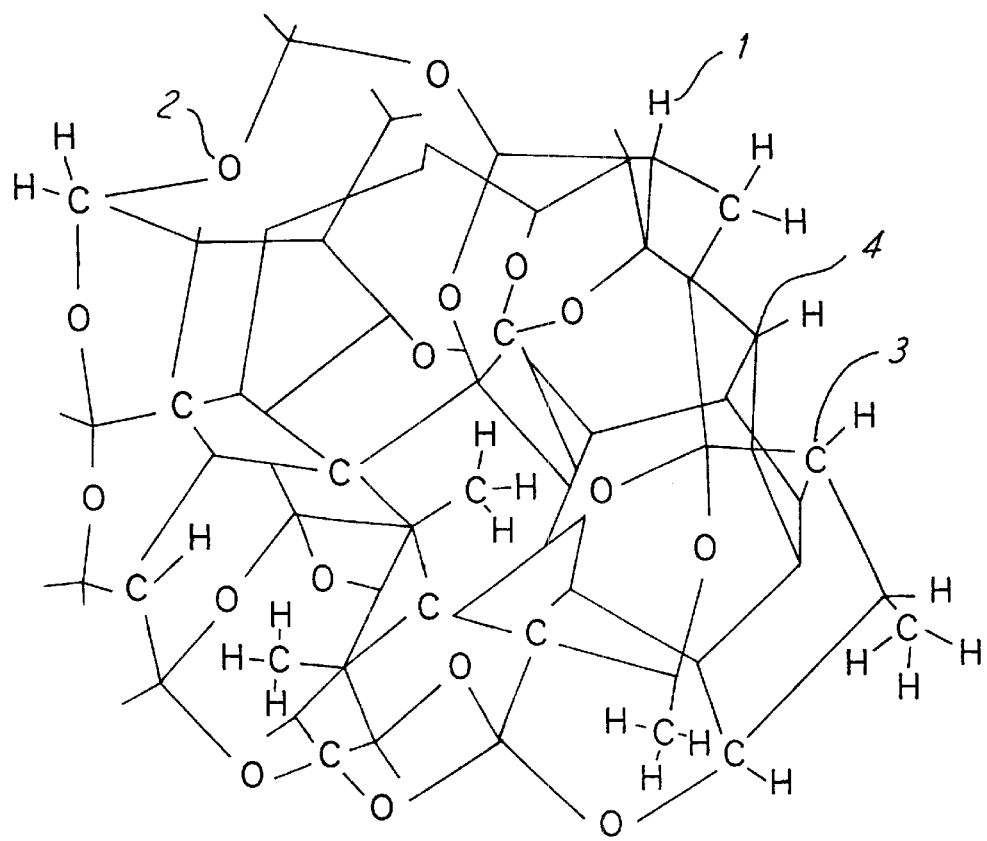
FIG. 2B is a schematic representation of the random covalent structure of the first phase of the present invention dual-phase material.

Referring now to FIG. 2B, the dark lines represent covalent bonds between the Si, C, O and H atoms. This is a random network, so that no fundamental repeating unit exists for the structure. The hydrogen atoms are shown as "H" labeled 1. The oxygen atoms in the network are shown as "O" and are labeled 2. The carbon atoms in the network are represented by "C" and are labeled 3. The silicon atoms in the network are represented by the intersection of four lines and are labeled 4. The oxygen atoms, 2, lie between 2 atoms of either C or Si. Located within the first phase is the second phase 32 of the present invention material. The second phase consists essentially of C and H atoms. The multiphase material further includes a multiplicity of pores of nanometer size, i.e., from 0.5 to 200 nanometer in diameter. The covalently bonded network structure of the first phase, also called the "host" matrix, is shown in FIG. 2B.

Figure 3:
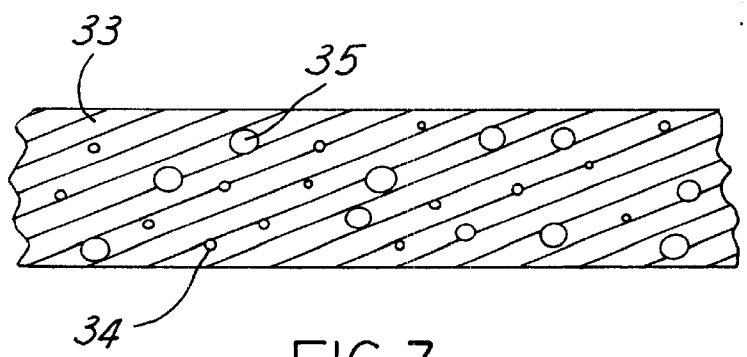
FIG. 3 is an enlarged, cross-sectional view of the present invention tri-phase material.

Referring to FIG. 3, the tri-phase material of the present invention is shown in an enlarged, cross-sectional view. The first phase 33 is a "host" matrix which is a hydrogenated oxidized silicon carbon material (SiCOH) consisting of Si, C, O and H in a covalently bonded network and having a dielectric constant of not more than 3.6. The structure of the first phase has been shown above in FIG. 2B. Located within the first phase is the second phase 34 of the present invention material and the third phase 35 of the present invention material. The second phase consists essentially of C and H atoms and a multiplicity of pores of a nanometer size, i.e., from 0.5 to 200 nanometer in diameter.

The third phase 35 may be open regions in the matrix that are created by the presence of the "guest" molecules. The open regions may be voids that are induced by the presence of the guest molecules, which disrupt the random network (FIG. 2B) of the first phase of the multiphase material of this invention. Alternatively, the third phase consists of C and H atoms, and a multiplicity of pores of a nanometer size. The size of the pores may be larger than the pores in the dual-phase composition. Specifically, the size of the pores in the third phase is from 0.5 to 100 nanometer in diameter.

EXAMPLE 1

In this implementation example, a plasma was operated in a continuous mode during film deposition. The gas mixture consisted of a mixture of TMCTS+He at a flow rate of 30 sccm and BCHD at a flow rate of 3 sccm. The pressure in the reactor was maintained at 500 m Torr. The substrate was positioned on the powered electrode to which a RF power of 15 W was applied at a frequency of 13.56 MHZ. The substrate acquired a self negative bias of −17 VDC. The film thus deposited had a dielectric constant of k=3.13 in as-deposited condition. After an anneal of 4 hours at 400 degrees C., the film has a dielectric constant of k=2.91

Figure 4:
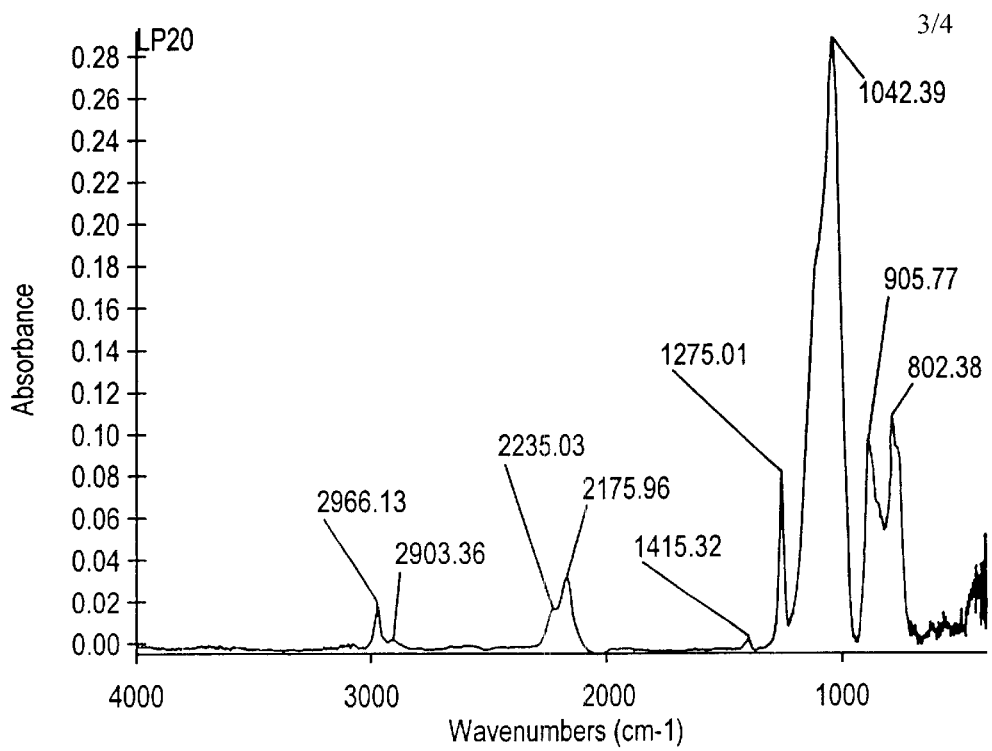
FIG. 4 is a FTIR (Fourier Transform Infrared) spectrum obtained from a single phase SiCOH film deposited from a mixture of tetramethyltetracyclosiloxane (TMCTS) and He.
Figure 5:
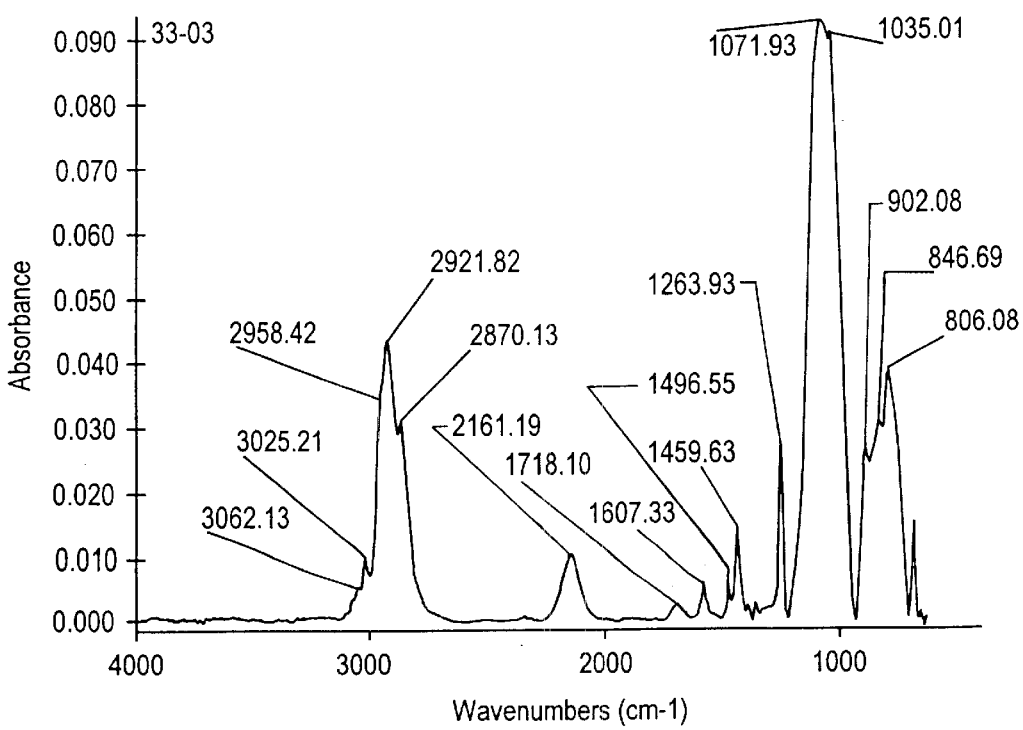
FIG. 5 is a FTIR spectrum obtained from the present invention dual-phase material deposited from a mixture of TMCTS+He and 2,5-norbornadiene ( also known as bicyclo[2.2.1]hepta-2,5-diene)

Results of the first embodiment are now discussed in reference to FIGS. 4 and 5. FIG. 4 presents a Fourier transform infrared (FTIR) spectrum of a typical SiCOH film. The spectrum displays a strong Si—O absorption band at 1000–1100 $cm^{-1}$, a Si—$CH_3$ absorption peak at 1275 $cm^{-1}$, a Si—H absorption band at 2150–2250 $cm^{-1}$ and small C—H absorption peaks at 2900–3000 $cm^{-1}$. The relative intensities of the CH, SiH and SiCH3 peaks as compared to the SiO peak of the SiCOH film are presented in Table 1.

FIG. 5 presents the FTIR spectrum obtained from a multiphase film prepared from a mixture of (TMCTS+He)+BCHD. The spectrum displays the Si—O, Si—$CH_3$, the Si—H, and C—H absorption peaks, as in FIG. 4. However, the intensity of the C—H absorption band at 2900–3000 $cm^{-1}$ is much stronger for the multiphase film than for the SiCOH film shown in FIG. 4. The relative intensities of the CH, SiH and $SiCH_3$ peaks as compared to the SiO peak for this film are also shown in Table 1. As can be seen in the table, the integrated area of C—H peak of the multiphase film is 40% of that of the Si—$CH_3$ peak, while it is only 2% of the Si—$CH_3$ peak in the SiCOH film. This is a clear indication that the multiphase film contains a significant amount of a secondary CHx (hydrocarbon) phase in addition to the SiCOH phase. Another indication of the secondary phase is provided by the splitting of the Si—O peak in the spectrum of the multiphase material seen in FIG. 5.

TABLE 1

| Relative integrated intensities of FTIR absorption peak | | | |
|---|---|---|---|
| Material | CH/SiO (%) | SiH/SiO (%) | SiCH/SiO (%) |
| SiCOH | 2 | 8 | 6 |
| Multiphase | 40 | 6 | 5 |

EXAMPLE 2

In this implementation example, the plasma was operated in a continuous mode during film deposition. The gas mixture consisted of a mixture of TMCTS+He at a flow rate of 30 sccm and BCHD at a flow rate of 1 sccm. The pressure in the reactor was maintained at 500 m Torr. The substrate was positioned on the powered electrode to which a RF power of 6 W was applied at a frequency of 13.56 MHZ. The substrate acquired a self negative bias of −25 VDC. The film deposited has a dielectric constant of k=2.82 in as-deposited condition. After an anneal of 4 hours at 400° C., the film has a dielectric constant of k=2.81.

EXAMPLE 3

In this implementation example, the plasma was operated in a pulsed mode during film deposition, i.e., with a plasma-on time of 18 ms and a plasma-off time of 182 ms per cycle. The other conditions are maintained the same as in Example 2.

EXAMPLE 4

In this example, a different precursor of trimethylsilane was used together with BCHD with the plasma operated in a continuous mode during film deposition. The pressure in the reactor was maintained at 200 mTorr. The substrate was positioned on the powered electrode to which a RF power of 9 W was applied at a frequency of 13.56 MHZ. The substrate acquired a self negative bias of −200 VDC. The primary phase in the dual-phase film thus deposited consists of Si, C and H without O.

EXAMPLE 5

In this implementation, a multiphase film is prepared by a method similar to the one described in Example 1 with the only difference that an additional noncyclic hydrocarbon of tertiary butyl ether (TBE) was added to the gas mixture. The resulting films consist of a SiCOH matrix, a CHx phase containing CH ring structures and a CHy phase containing linear CH structures. If the ring hydrocarbon precursors contains phenolic rings, the first CHx phase in the film will include aromatic CH structures.

The present invention novel material consists of two or more phases. The first phase composition includes atoms of Si, C, O and H. A suitable concentration range can be advantageously selected from between about 5 and about 40 atomic percent of Si; between about 5 and about 45 atomic percent of C; between about 0 and about 50 atomic percent of 0; and between about 10 and about 55 atomic percent of H. It should be noted that when the atomic percent of O is 0, a composition of SiCH is produced which has properties similar to that of SiCOH and therefore, may also be suitably used as a present invention composition. For instance, Example 4 describes a film containing a first phase of SiCH with no oxygen. The SiCH film may be deposited by flowing a precursor gas containing Si, C and H into a plasma enhanced chemical vapor deposition chamber. The second phase composition includes atoms of C and H and optional F and O. A suitable concentration range can be advantageously selected from between about 90 and about 45 atomic percent of C and between about 10 and about 55 atomic percent of H. The present invention material further includes molecular size voids dispersed within the multiphase material. The present invention material composition may further include at least one element such as F, N or Ge while producing similarly desirable results.

The films deposited as described above are characterized by FTIR spectrum similar to the one shown in FIG. 5. The spectrum has strong Si—O absorption band at 1000–1100 $cm^{-1}$, a Si—$CH_3$ absorption peak at 1275 $cm^{-1}$, a Si—H absorption band at 2150–2250 $cm^{-1}$ and a very strong C—H absorption band at 2900–3000 $cm^{-1}$. The relative intensities of the CH, SiH and $SiCH_3$ peaks as compared to the SiO peak of the SiCOH film are presented in Table 1. The relative intensities of the peaks can change with changing deposition conditions and changing precursor gases. The SiO absorption band can be deconvoluted in two peaks at 1070 $cm^{-1}$ and 1030 $cm^{-1}$ with the first peak indicating the existence of a nanoporous, Si—O cage structure The large ratio of the integrated area of C—H peak to that of the Si—$CH_3$ peak (40%, see Table 1) compared to a ratio of only 2% of the SiCOH film is a clear indication that the multiphase film contains a significant amount of a secondary CHx (hydrocarbon) phase in addition to the SiCOH phase.

Other gases such as Ar, $H_2$, and $N_2$ can be used as carrier gases. If the precursor has sufficient vapor pressure, no carrier gas may be needed. An alternative way to transport a liquid precursor to the plasma reactor is by use of a liquid delivery system. Nitrogen, hydrogen, germanium, or fluorine containing gases can be added to the gas mixture in the reactor if needed to modify the low-k film properties. The multiphase films may thus contain atoms such as Ge, N and F.

If desired, the deposited multiphase films may optionally be further modified before undergoing further integration processing to either evaporate the residual volatile contents and to dimensionally stabilize the films or just dimensionally stabilize the films. The stabilization process can be carried out in a furnace annealing step at between 300° C. and 400° C. for a time period between about 0.25 hours and about 4 hours. The stabilization process can also be performed in a rapid thermal annealing process at temperatures above 300° C. The dielectric constant of the multiphase films obtained according to the present invention novel process are not higher than 3.2. The thermal stability of the multiphase films obtained according to the present invention process is up to at least a temperature of 350° C.

The multiphase films obtained by the present invention process are characterized by dielectric constants of k<3.2, and are thermally stable for process integration in a BEOL interconnect structure which is normally processed at temperatures of up to 400° C. Furthermore, the multiphase films have extremely low crack propagation velocities in water, i.e., below $10^{-9}$ m/s and may even be below $10^{-11}$ m/s. The present invention novel material and process can therefore be easily adapted in producing multiphase films as intralevel and interlevel dielectrics in BEOL processes for logic and memory devices.

The electronic devices formed by the present invention novel method are shown in FIGS. 6~9. It should be noted that the devices shown in FIGS. 6~9 are merely illustration examples of the present invention method while an infinite number of other devices may also be formed by the present invention novel method.

Figure 6:
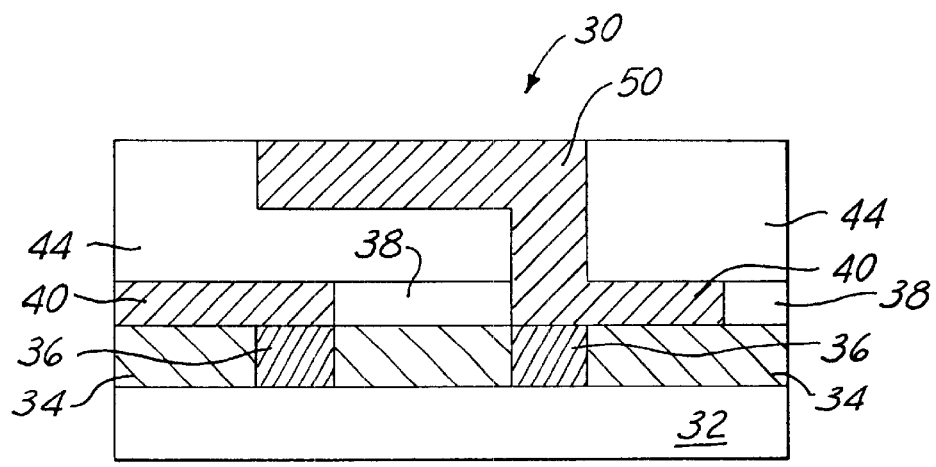
FIG. 6 is an enlarged, cross-sectional view of a present invention electronic device having an intralevel dielectric layer and an interlevel dielectric layer formed of the multiphase material.

In FIG. 6, an electronic device 30 built on a silicon substrate 32 is shown. On top of the silicon substrate 32, an insulating material layer 34 is first formed with a first region of metal 36 embedded therein. After a CMP process is conducted on the first region of metal 36, a multiphase film 38 of the present invention is deposited on top of the first layer of insulating material 34 and the first region of metal 36. The first layer of insulating material 34 may be suitably formed of silicon oxide, silicon nitride, doped varieties of these materials, or any other suitable insulating materials. The multiphase film 38 is then patterned in a photolithography process and a conductor layer 40 is deposited thereon. After a CMP process on the first conductor layer 40 is carried out, a second layer of multiphase film 44 is deposited by a plasma enhanced chemical vapor deposition process overlying the first multiphase film 38 and the first conductor layer 40. The conductor layer 40 may be deposited of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the second multiphase film layer 44 is conducted followed by a deposition process for the second conductor material. The second region of conductor 50 may also be deposited of either a metallic material or a nonmetallic material, similar to that used in depositing the first conductor layer 40. The second region of conductor 50 is in electrical communication with the first region of conductor 40 and is embedded in the second layer of multiphase insulator 44. The second layer of multiphase film is in intimate contact with the first layer of insulating material 38. In this example, the first layer of insulating material 38 of multiphase is an intralevel dielectric material, while the second layer of insulating material, i.e., the multiphase film 44 is both an intralevel and an interlevel dielectric. Based on the low dielectric constant of the multiphase film, superior insulating property can be achieved by the first insulating layer 38 and the second insulating layer 44.

Figure 7:
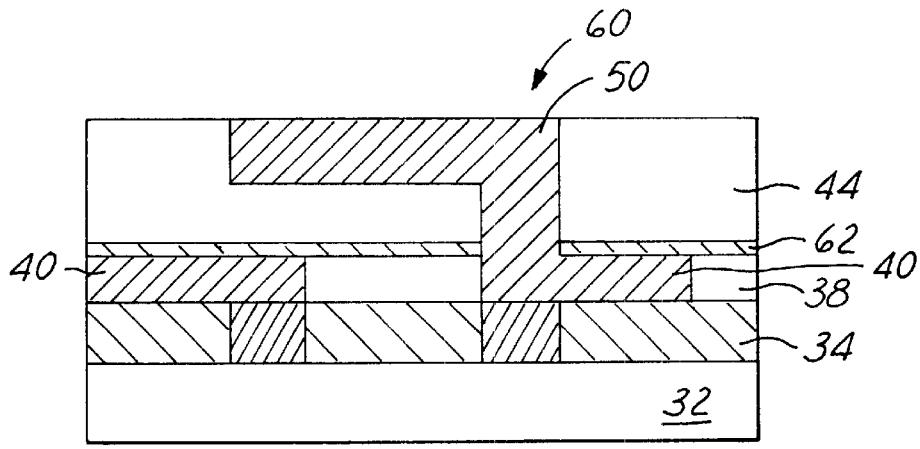
FIG. 7 is an enlarged, cross-sectional view of the present invention electronic structure of FIG. 6 having an additional diffusion barrier dielectric cap layer deposited on top of the multiphase material film.

FIG. 7 shows a present invention electronic device 60 similar to that of electronic device 30 shown in FIG. 6, but with an additional dielectric cap layer 62 deposited between the first insulating material layer 38 and the second insulating material layer 44. The dielectric cap layer 62 can be suitably formed of a material such as silicon oxide, silicon nitride, silicon oxinitride, refractory metal silicon nitride with the refractory metal being Ta, Zr, Hf or W, silicon carbide, silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 8:
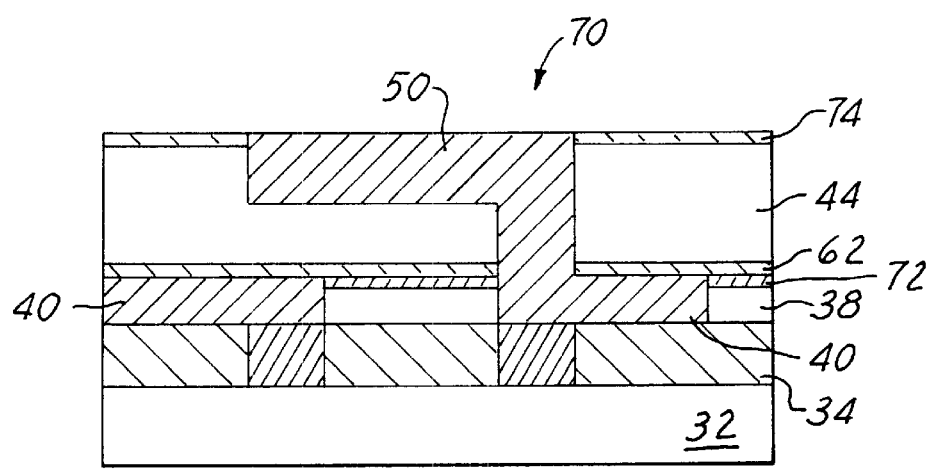
FIG. 8 is an enlarged, cross-sectional view of the present invention electronic structure of FIG. 7 having an additional RIE hard mask/polish stop dielectric cap layer and a dielectric cap diffusion barrier layer deposited on top of the polish-stop layer.

Another alternate embodiment of the present invention electronic device 70 is shown in FIG. 8. In the electronic device 70, two additional dielectric cap layers 72 and 74 which act as a RIE mask and CMP (chemical mechanical polishing) polish stop layer are used. The first dielectric cap layer 72 is deposited on top of the first multiphase insulating material layer 38 and used as a RIE mask. The function of the second dielectric layer 74 is to provide an end point for the CMP process utilized in planarizing the first conductor layer 40. The polish stop layer 74 can be deposited of a suitable dielectric material such as silicon oxide, silicon nitride, silicon oxinitride, refractory metal silicon nitride with the refractory metal being Ta, Zr, Hf or W, silicon carbide, silicon carbo-oxide (SiCO), and their hydrogenated compounds. The top surface of the dielectric layer 72 is at the same level as the first conductor layer 40. A second dielectric layer 74 can be added on top of the second multiphase insulating material layer 44 for the same purposes.

Figure 9:
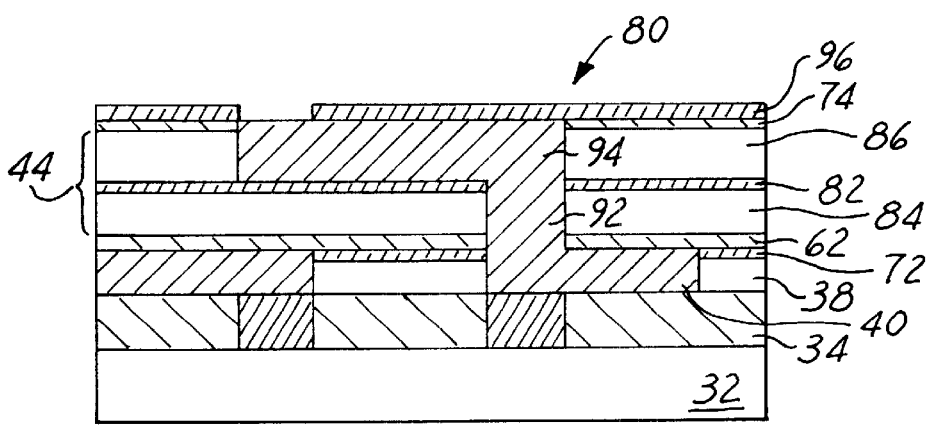
FIG. 9 is an enlarged, cross-sectional view of the present invention electronic structure of FIG. 8 having additional RIE hard mask/polish stop dielectric layers deposited on top of the multiphase material film.

Still another alternate embodiment of the present invention electronic device 80 is shown in FIG. 9. In this alternate embodiment, an additional layer 82 of dielectric material is deposited and thus dividing the second insulating material layer 44 into two separate layers 84 and 86. The intralevel and interlevel dielectric layer 44 formed of a multiphase material, shown in FIG. 8, is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material, and a second dielectric cap layer on top of the third layer of insulating material, wherein the first and the second dielectric cap layers are formed of a material that includes atoms of Si, C, O and H, or preferably a multiphase composition.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of a multiphase material including atoms of Si, C, O and H deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of a multiphase material including atoms of Si, C, O and H.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of a multiphase material including atoms of Si, C, O and H.

Still other alternate embodiments of the present invention includes an electronic structure that has layers of insulating material as intralevel or interlevel dielectrics in a wiring structure similar to that described immediately above but further includes a dielectric cap layer which is formed of a multiphase material including atoms of Si, C, O and H situated between an interlevel dielectric layer and an intralevel dielectric layer.

The present invention novel method and the electronic structures formed by such method have therefore been amply described in the above descriptions and in the appended drawings of FIGS. 1~9. It should be emphasized that the examples of the present invention electronic structures shown in FIGS. 6~9 are merely used as illustrations for the present invention novel method which, obviously, can be applied in the fabrication of an infinite number of electronic devices.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

What is claimed is:

1. A method for fabricating a multiphase low dielectric constant film comprising the steps of:
    providing a plasma enhanced chemical vapor deposition (PECVD) chamber,
    positioning a substrate in said chamber,
    flowing a first precursor gas consisting essentially of Si and at least two elements selected from the group consisting of C, O and H into said PECVD chamber,
    flowing at least a second precursor gas consisting essentially of carbon and hydrogen containing molecules, said at least a second precursor gas is optionally mixed with an inert carrier gas, and
    depositing a multiphase film comprising a first phase consisting essentially of Si, C, O and H and at least a second phase consisting essentially of C, H and a multiplicity of nanometer-sized pores on said substrate, wherein said at least a second phase is dispersed in said first phase and said multiphase film has a dielectric constant of not more than 3.2.

2. A method according to claim 1, wherein said plasma enhanced chemical vapor deposition chamber is a parallel plate-type plasma reactor.

3. A method according to claim 1 further comprising the step of depositing said multiphase film in a continuous mode in said PECVD chamber.

4. A method according to claim 1 further comprising the step of depositing said multiphase film in a pulsed mode in said PECVD chamber.

5. A method according to claim 1 further comprising the step of adjusting the depositing conditions to minimize the dissociation of the second precursor molecules.

6. A method for fabricating a multiphase low dielectric constant film according to claim 1 further comprising the optional step of heat treating said film at a temperature not lower than 200° C.

7. A method according to claim 1 wherein said at least a second precursor gas includes molecules of a ring structure.

8. A method according to claim 1 wherein said first precursor gas further includes methylsilanes.

9. A method according to claim 1 wherein said first precursor gas has molecules with ring structures selected from the group consisting of 1,3,5,7-tetramethylcyclotetrasiloxane (TMCTS or $C_4H_{16}O_4Si_4$), tetraethylcyclotetrasiloxane ($C_8H_{24}O_4Si_4$), decamethylcyclopentasiloxane ($C_{10}H_{30}O_5Si_5$), molecules of methylsilanes mixed with an oxidizing agent comprising $O_2$ or $N_2O$ and precursor mixtures comprising Si, O, and C.

10. A method according to claim 1 wherein said at least a second precursor gas consisting essentially of hydrocarbons, ethers, alcohols, esters, ketones, aldehydes, amines or other O, N or F containing hydrocarbons.

11. A method according to claim 1, wherein said at least a second precursor gas consists essentially of hydrocarbon molecules selected from the group consisting of 2,5-norbornadiene, norbonylene 2,5-norbornadiene, norbornane tricyclo 3,2,1,0-octane, tricyclo 3,2,2,0-nonane, spiro 3,4-octane, spiro 4,5-nonane, spiro 5,6-decane, benzene, toluene, xylene, and anisole.

12. A method according to claim 7, wherein said at least a second precursor gas is bicyclo 2,2,1-hepta-2,5-diene.

13. A method according to claim 1, wherein said at least a second precursor gas further includes at least two different carbon and hydrogen containing molecules selected from the group consisting of hydrocarbons, ethers, alcohols, esters, ketones, aldehydes, amines and other O, N or F containing hydrocarbons.

14. A method according to claim 1 further comprising the step of mixing said first and said at least a second precursor gas with at least one gas selected from the group consisting of hydrogen, oxygen, germanium, nitrogen and fluorine containing gases.

15. A method for fabricating a multiphase low dielectric constant film comprising the steps of:
    providing a deposition chamber,
    positioning a substrate in said chamber,
    providing a plasma source chamber juxtaposed to and in fluid communication with said deposition chamber,
    flowing a first precursor gas containing Si and at least two elements selected from the group consisting of C, O and H into said plasma source chamber, dissociating and ionizing said precursor and flowing it into said deposition chamber,
    flowing at least a second precursor gas comprising carbon and hydrogen containing molecules, or carbon and hydrogen containing molecules diluted in an inert carrier gas into said deposition chamber, and
    depositing a multiphase film comprising a first phase consisting essentially of Si, C, O and H and at least a second phase consisting essentially of C, H and a multiplicity of nanometer-sized pores on said substrate wherein said at least a second phase is dispersed in said first phase and said multiphase film has a dielectric constant of not more than 3.2.

16. A method for fabricating a multiphase low dielectric constant film according to claim 15 further comprising the step of operating said plasma source chamber in a continuous mode.

17. A method for fabricating a multiphase low dielectric constant film according to claim 15 further comprising the step of operating said plasma source chamber in a pulsed mode.

18. A method for fabricating a multiphase low dielectric constant film according to claim 15 further comprising the step of adjusting the depositing conditions to minimize the dissociation of hydrocarbon molecules.

19. A method for fabricating a multiphase low dielectric constant film according to claim 15 further comprising the optional step of heat treating said film at a temperature not lower than 200° C.

20. A method for fabricating a multiphase low dielectric constant film according to claim 18 wherein said at least a second precursor gas comprises molecules of a ring structure.

21. A method for fabricating a multiphase low dielectric constant film according to claim 15 wherein said first precursor gas further comprises methylsilanes.

22. A method according to claim 15 wherein said first precursor gas has molecules with ring structures selected from the group consisting of 1,3,5,7-tetramethylcyclotetrasiloxane (TMCTS or $C_4H_{16}O_4Si_4$), tetraethylcyclotetrasiloxane ($C_8H_{24}O_4Si_4$), decamethylcyclopentasiloxane ($C_{10}H_{30}O_5Si_5$), and precursor mixtures comprising Si, O, and C.

23. A method for fabricating a multiphase low dielectric constant film according to claim 1, wherein said at least a second precursor gas consisting essentially of hydrocarbons, ethers, alcohols, esters, ketones, aldehydes, amines or other O, N or F containing hydrocarbons.

24. A method according to claim 15, wherein said at least a second precursor gas consists essentially of hydrocarbon molecules selected from the group consisting of 2,5-norbornadiene, norbonylene 2,5-norbornadiene, tricyclo 3,2,1,0-octane, tricyclo 3,2,2,0-nonane, spiro 3,4-octane, spiro 4,5-nonane, spiro 5,6-decane, benzene, toluene, xylene, and anisole.

25. A method according to claim 15, wherein said at least a second precursor gas is bicyclo 2,2,1-hepta-2,5-diene.

26. A method for fabricating a multiphase low dielectric constant film according to claim 18, wherein said at least a second precursor gas further comprises at least two different carbon and hydrogen containing molecules selected from the group consisting of hydrocarbons, ethers, alcohols, esters, ketones, aldehydes, amines and other O, N or F containing hydrocarbons.

27. A method for fabricating a multiphase low dielectric constant film according to claim 18 further comprising the step of mixing said first and said at least a second precursor gas with at least one gas selected from the group consisting of hydrogen, oxygen, germanium, nitrogen and fluorine containing gases.

* * * * *